(12) United States Patent
Iwamoto et al.

(10) Patent No.: US 6,487,226 B1
(45) Date of Patent: Nov. 26, 2002

(54) SEMICONDUCTOR LIGHT EMITTING DEVICE

(75) Inventors: Koji Iwamoto; Hiroki Nagasaki; Shoichiro Matsunaga; Shoji Hirata, all of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/145,430

(22) Filed: Sep. 1, 1998

(30) Foreign Application Priority Data

Sep. 2, 1997 (JP) .............................................. 9-237089

(51) Int. Cl.[7] .................................................. H01S 5/06
(52) U.S. Cl. ............................................ 372/46; 372/47
(58) Field of Search ............................. 372/45, 46, 43, 372/44

(56) References Cited

U.S. PATENT DOCUMENTS

| | | | | |
|---|---|---|---|---|
| 5,173,447 A | * | 12/1992 | Ijichi ........................... 437/129 |
| 5,189,680 A | * | 2/1993 | Kimura ........................ 372/46 |
| 5,282,218 A | * | 1/1994 | Okajima ...................... 372/46 |
| 5,394,417 A | * | 2/1995 | Takemi ........................ 372/45 |
| 5,404,369 A | * | 4/1995 | Mori ............................ 372/45 |
| 5,408,487 A | * | 4/1995 | Uchida ........................ 372/45 |
| 5,901,165 A | * | 5/1999 | Uchida ........................ 372/45 |
| 6,014,394 A | * | 1/2000 | Tomita ........................ 372/45 |

* cited by examiner

*Primary Examiner*—Paul Ip
*Assistant Examiner*—Jeffrey Zahn
(74) *Attorney, Agent, or Firm*—Sonnenschein, Nath & Rosenthal

(57) ABSTRACT

A semiconductor light emitting device having a structure including an active layer between a p-type cladding layer and an n-type cladding layer on a base body comprises at least one of the p-type cladding layer and the n-type cladding layer has a lattice mismatch relative to the base body not smaller than $2.0 \times 10^{-4}$ and not larger than $3.0 \times 10^{-3}$ or not smaller than $-1.5 \times 10^{-3}$ and not larger than $-2.0 \times 10^{-4}$. Another semiconductor light emitting device comprises at least one of the p-type cladding layer and the n-type cladding layer and the active layer have a lattice mismatch relative to the base body not smaller than $2.0 \times 10^{-4}$ and not larger than $3.0 \times 10^{-3}$ or not smaller than $-1.5 \times 10^{-3}$ and not larger than $-2.0 \times 10^{-4}$.

34 Claims, 4 Drawing Sheets

SEMICONDUCTOR LIGHT EMITTING DEVICE

BACKGROUND OF THE INVENTION

1. Field of the Invention

This invention includes to a semiconductor light emitting device and an optical recording and/or reproducing apparatus.

2. Description of the Related Art

Light may be amplified by stimulating the emission of radiation having discrete frequencies from incident electromagnetic radiation of mixed frequencies. In a light emitting device such as a semiconductor laser, especially in AlGaInP semiconductor lasers, it is difficult to make a sufficiently high barrier of heterojunction between the active layer and the cladding layer, impurity doping control technologies seriously affect the device characteristics.

More specifically, there are known AlGaInP semiconductor lasers using known cladding layers near the active layer by controlling the impurity doping position during the manufacturing process. Conventional AlGaInP semiconductor laser having non-doped cladding layers near the active layer are advantageous in preventing diffusion of impurities from the cladding layers.

These conventional AlGaInP semiconductor lasers, however, involve some problems. Namely, if the impurity doping position is remote from the active layer, then the efficiency of converting an injected current into light decreases, and the operation current increases. In contrast, if the impurity doping position is nearer to the active layer, diffusion of impurities reach the active layer by the annealing process and so on, and deteriorates the device in a short time as short as several hours. This results in shortening the life of the device and decreasing the reliability of the device.

Thus, the conventional AlGaInP semiconductor laser needs to control impurity doping with high accuracy, so there is difficulty in its manufacturing.

OBJECTS AND SUMMARY OF THE INVENTION

It is therefore an object of the invention to provide a semiconductor light emitting device which is improved in emission efficiency, operative with a low current, improved in reliability, and can be manufactured easily, and to provide an optical recording and/or reproducing apparatus using the semiconductor light emitting device as is light source.

According to the first aspect of the invention, there is provided a semiconductor light emitting device having a structure including an active layer between a p-type cladding layer and an n-type cladding layer on a base body, comprising:

at least one of the p-type cladding layer and the n-type cladding layer has a lattice mismatch relative to the base body not smaller than $2.0 \times 10^{-4}$ and not larger than $3.0 \times 10^{-3}$ or not smaller than $-1.5 \times 10^{-3}$ and not larger than $-2.0 \times 10^{-4}$.

According to the second aspect of the invention, there is provided a semiconductor light emitting device having a structure including an active layer between a p-type cladding layer and an n-type cladding layer on a base body, comprising:

at least one of the p-type cladding layer and the n-type cladding layer, and the active layer have a lattice mismatch relative to the base body not smaller than $2.0 \times 10^{-4}$ and not larger than $3.0 \times 10^{-3}$ or not smaller than $-1.5 \times 10^{-3}$ and not larger than $-2.0 \times 10^{-4}$.

According to the third aspect of the invention, there is provided a semiconductor light emitting device having a structure including an active layer between a p-type cladding layer and an n-type cladding layer on a base body, comprising:

the p-type cladding layer, n-type cladding layer and active layer are in lattice mismatch with the base body.

According to the fourth aspect of the intention, there is provided an optical recording and/or reproducing apparatus using as a light source thereof a semiconductor light emitting device having a structure including an active layer between a p-type cladding layer and an n-type cladding layer on a base body, comprising:

at least one of the p-type cladding layer and the n-type cladding layer has a lattice mismatch relative to the base body not smaller than $2.0 \times 10^{-4}$ and not larger than $3.0 \times 10^{-3}$ or not smaller than $-1.5 \times 10^{-3}$ and not larger than $-2.0 \times 10^{-4}$.

According to the fifth aspect of the invention, there is provided an optical recording and/or reproducing apparatus using as a light source thereof a semiconductor light emitting device having a structure including an active layer between a p-type cladding layer and an n-type cladding layer on a base body, comprising:

at least one of the p-type cladding layer and the n-type cladding layer, and the active layer have a lattice mismatch relative to the base body not smaller than $2.0 \times 10^{-4}$ and not larger than $3.0 \times 10^{-3}$ or not smaller than $-1.5 \times 10^{-3}$ and not larger than $-2.0 \times 10^{-4}$.

When the semiconductor layer stacked on the base body has a lattice mismatch with respect to the base body, the degree of the lattice mismatch $\Delta a/a$ is expressed as $\Delta a/a \equiv (a_2 - a_1)/a_1$ where $a_1$ is the lattice constant of the base body, and $a_2$ is the lattice constant of the semiconductor layer. In the present invention, the degree of the lattice mismatch is determined from the viewpoint of effectively preventing diffusion of impurities and from the view point of preventing dislocation in the crystal to be not smaller than $2.0 \times 10^{-4}$ and not larger than $3.0 \times 10^{-3}$ or not smaller than $-1.5 \times 10^{-3}$ and not larger than $-2.0 \times 10^{-4}$, for example, or more preferably, not smaller than $3.0 \times 10^{-4}$ and not larger than $3.0 \times 10^{-3}$ or not smaller than $-1.5 \times 10^{-3}$ and not larger than $-3.0 \times 10^{-4}$.

In the first and fourth aspects of the invention, the lattice mismatch may be either substantially even or uneven within the p-type cladding layer or the n-type cladding layer. In the second, third and fifth aspects of the invention, the lattice mismatch may be either substantially even or uneven within the p-type cladding layer, n-type cladding layer or active layer, or it may be substantially even among the p-type cladding layer, active layer and n-type cladding layer.

In the first, second, fourth and fifth aspects of the invention, one of the p-type cladding layer and the n-type cladding layer may include lattice mismatch, or both of them may include lattice mismatch. In the present invention, if both the p-type cladding layer and the n-type cladding layer include lattice mismatch, lattice mismatch of the p-type cladding layer with respect to the base body may be not smaller than $2.0 \times 10^{-4}$ and not larger than $3.0 \times 10^{-3}$, and lattice mismatch of the n-type cladding layer with respect to the base body may be not smaller than $-1.5 \times 10^{-3}$ and not larger than $-2.0 \times 10^{-4}$. The semiconductor light emitting device may include a first optical guide layer between the p-type cladding layer and the active layer and a second optical guide layer between the n-type cladding layer and the active layer. In this case, at least one of the first optical guide layer and the second optical guide layer may have lattice mismatch with respect to the base body in the range not smaller than $2.0 \times 10^{-4}$ and not larger than $3.0 \times 10^{-3}$ or not smaller than $-1.5 \times 10^{-3}$ and not larger than $-2.0 \times 10^{-4}$.

In the present invention, the semiconductor light emitting device is typically an AlGaInP semiconductor light emitting device, and a GaAs substrate, for example, is used as the base body.

According to the first, second, fourth and fifth aspects of the invention, at least one of the p-type cladding layer and the n-type cladding layer has lattice mismatch with respect to the base body within the range not smaller than $2.0 \times 10^{-4}$ and not larger than $3.0 \times 10^{-3}$ or not smaller than $-1.5 \times 10^{-3}$ and not larger than $-2.0 \times 10^{-4}$, or at least one of the p-type cladding layer and the n-type cladding layer, and the active layer have lattice. mismatch with respect to the base body within the range not smaller than $2.0 \times 10^{-4}$ and not larger than $3.0 \times 10^{-3}$ or not smaller than $-1.5 \times 10^{-3}$ and not larger than $-2.0 \times 10^{-4}$. Therefore, diffusion of impurities in the p-type cladding layer or in the n-type cladding layer can be prevented. As a result, impurities in the p-type cladding layer or in the n-type cladding layer from diffusing into the active layer.

According to the third aspect of the invention, the active layer, p-type cladding layer and n-type cladding layer have lattice mismatch with respect to the base body. Therefore, diffusion of impurities in the p-type cladding layer or in the n-type cladding layer can be prevented. As a result, impurities in the p-type cladding layer or in the n-type cladding layer from diffusing into the active layer.

Still unknown are details of the mechanism of preventing diffusion of impurities in cladding layers. Presumably because the energy of the system is lower when group II impurities in the cladding layers having plus lattice mismatch with respect to the GaAs substrate, for example, diffuse in the opposite direction from the GaAs substrate rather than diffusing toward the substrate and when group VI impurities in the cladding layer having minus lattice mismatch with respect to the GaAs substrate diffuse toward the GaAs substrate rather than diffusing away from the substrate, it might result in preventing diffusion of impurities from cladding layers into the active layer. Alternatively, it is possible that migration energy of impurities is high in cladding layers having plus or minus lattice mismatch with respect to the GaAs substrate, and it results in preventing diffusion of impurities. It is also presumed that, in a cladding layer having plus lattice mismatch with respect to the GaAs substrate, the density of group III holes assisting diffusion of group II impurities replacing group III atoms to become acceptor impurities or group IV impurities replacing group III atoms to become donor impurities decreases, and in a cladding layer having minus lattice mismatch with respect to the GaAs substrate, the density of group V holes assisting diffusion of replacing group V atoms to become donor impurities decreases, and it results in preventing diffusion of impurities.

The above, and other, objects, features and advantage of the present invention will become readily apparent from the following detailed description thereof which is to be read in connection with the accompanying drawings.

BRIEF DESCRIPTION OF THE DRAWINGS

FIG. 1A is a detailed view of active layer 4 that conceptually illustrates quantum well layer 4a and barrier layer 4b.

DETAILED DESCRIPTION OF THE PREFERRED EMBODIMENTS

Figure 1:
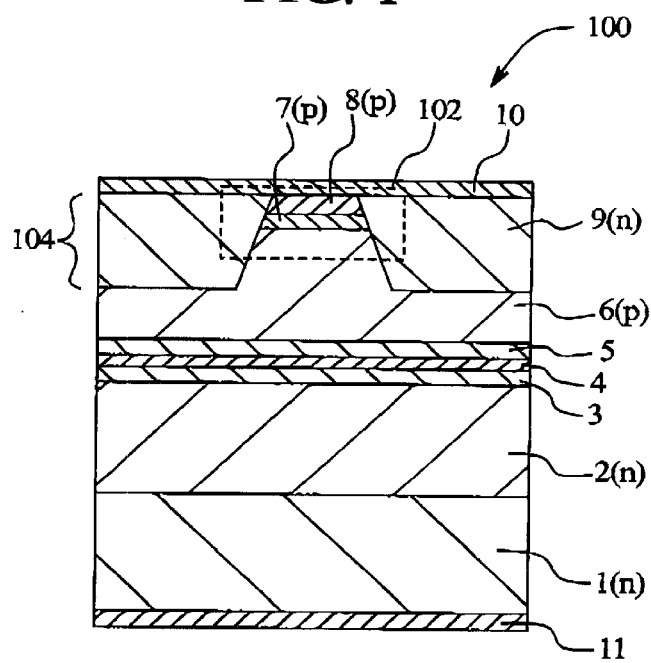
FIGS. 1 and 1A are cross-sectional views of an index-guided AlGaInP semiconductor laser according to the first embodiment of the invention.

Explained below are some embodiments of the invention with reference to the drawings. In all of the drawings showing embodiments, the same or equivalent elements are labeled with common reference numerals.

Figure 2:
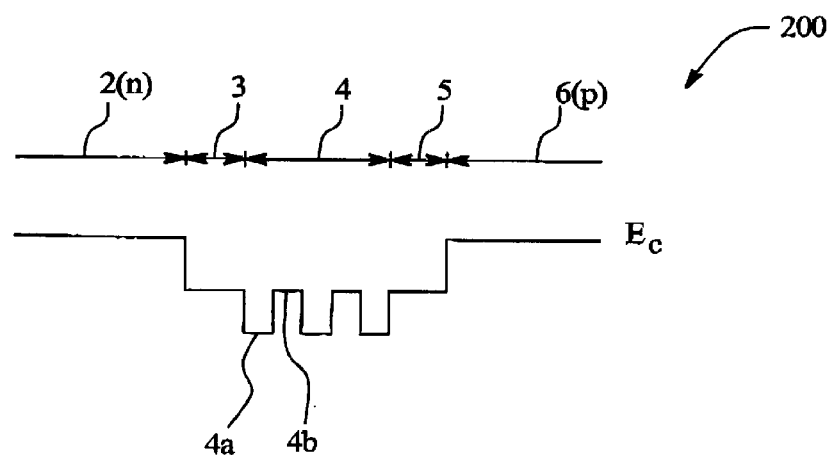
FIG. 2 is an energy band diagram of the index-guided AlGaInP semiconductor laser according to the first embodiment of the invention.

First explained is the first embodiment of the invention. FIG. 1 is a cross-sectional view of an index-guided AlGaInP semiconductor laser 100 taken as the first embodiment of the invention. The AlGaInP semiconductor laser 100 has a SCH structure (Separate Confinement Heterostructure), and its active layer 4 has a multi quantum well (MQW) structure. FIG. 2 is an energy band diagram 200 of the AlGaInP semiconductor laser 100 showing, especially, its conduction band. In FIG. 2, $E_c$ is the bottom energy of the conduction band.

Figure 1A:
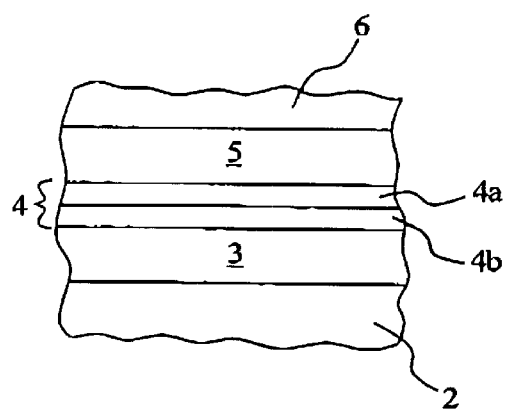

As shown in FIGS. 1 and 2, the AlGaInP semiconductor laser 100 according to the first embodiment includes substrate 1, an n-type $(Al_{x1}Ga_{1-x1})_{1-y1}In_{y1}P$ cladding layer 2, $(Al_{x2}Ga_{1-x2})_{1-y2}In_{y2}P$ optical guide layer 3, active layer 4 including $Ga_{1-z}In_zP$ quantum well layers 4a and $(Al_{x2}Ga_{1-x2})_{1-y2}In_{y2}P$ barrier layers 4b (FIG. 1A), $(Al_{x2}Ga_{1-x2})_{1-y2}In_{y2}P$ optical guide layer 5, p-type $(Al_{x1}Ga_{1-x1})_{1-y1}In_{y1}P$ cladding layer 6, p-type GaInP intermediate layer 7 and p-type GaAs cap layer 8 sequentially stacked on n-type GaAs substrate 1. An upper-lying portion 102 of the p-type $(Al_{x1}Ga_{1-x1})_{1-y1}In_{y1}P$ cladding layer 6, p-type GaInP intermediate layer 7 and p-type GaAs cap layer 8 are shaped into a stripe extending in one direction. Opposite sides of the stripe portion 102 are buried with an n-type GaAs current blocking layer 9 to form a current blocking structure 104.

Formed on the p-type GaAs cap layer 8 and the n-type GaAs current locking layer 9 is a p-side electrode 10 such as Ti/Pt/Au electrode. Formed on the bottom surface of the n-type GaAs substrate 1 is an n-side electrode 11 such as AuGe/Ni/Au electrode.

The mole fraction x1 of Al in the n-type $(Al_{x1}Ga_{1-x1})_{1-y1}In_{y1}P$ cladding layer 2 and the p-type $(Al_{x1}Ga_{1-x1})_{1-y1}In_{y1}P$ cladding layer 6 is larger than the mole fraction x2 of Al in the $(Al_{x2}Ga_{1-x2})_{1-y2}In_{y2}P$ optical guide layers 3, 5 and the $(Al_{x2}Ga_{1-x2})_{1-y2}In_{y2}P$ barrier layers 4b in the active layer 4. Namely, for example, x1=0.7, and x2=0.5.

Usable as donor impurities of the n-type $(Al_{x1}Ga_{1-x1})_{1-y1}In_{y1}P$ cladding layer 2 and the n-type GaAs current blocking layer 9 are Se and Si, for example. In this case, Se, for example, is used as the donor impurity. Usable as acceptor impurities of the p-type $(Al_{x1}Ga_{1-x1})_{1-y1}In_{y1}P$ cladding layer 6, p-type GaInP intermediate layer 7 and p-type GaAs cap layer 8 are Zn and Mg, for example. In this case, Zn, for example, is used as the acceptor impurity. The impurity concentration of the n-type $(Al_{x1}Ga_{1-x1})_{1-y1}In_{y1}P$ cladding layer 2 may be about $1\times10^{17}$~$5\times10^{17}/cm^3$, the impurity concentration of the p-type $(Al_{x1}Ga_{1-x1})_{1-y1}In_{y1}P$ cladding layer 6 may be about $1\times10^{18}/cm^3$, and the impurity concentration of the n-type GaAs current blocking layer 9 may be about $1\times10^{17}/cm^3$.

Exemplary thicknesses of semiconductor layers forming the AlGaInP semiconductor laser are 1 μm of the n-type $(Al_{x1}Ga_{1-x1})_{1-y1}In_{y1}P$ cladding layer 2, 10~50 nm of the $(Al_{x2}Ga_{1-x2})_{1-y2}In_{y2}P$ optical guide layers 3, 5, 5 nm for each of the $Ga_{1-z}In_zP$ quantum well layers 4a and the $(Al_{x2}Ga_{1-x2})_{1-y2}In_{y2}P$ barrier layers 4b in the active layer 4, 1 μm of the entirety of the p-type $(Al_{x1}Ga_{1-x1})_{1-y1}In_{y1}P$ cladding layer, 30 nm of the p-type GaInP intermediate layer 7, and 0.3 μm of the p-type GaAs cap layer 8. The width of the stripe is 5 μm, for example, and the thickness of the p-type $(Al_{x1}Ga_{1-x1})_{1-y1}In_{y1}P$ cladding layer 6 at opposite sides of the stripe portion is 0.3 μm. The active layer 4 has three to seven $Ga_{1-z}In_zP$ quantum well layers 4a, for example.

Regarding crystal structure in materials, all metals, most ceramic materials, and some polymers crystallize when they solidify. The term crystal may imply that a material has a repeatable pattern that creates long-range order such that the atoms are arranged in a pattern that is repeated at regular intervals millions of times in all directions of space.

A lattice may be viewed as a regular spatial display of points representing, for example, the sites of atoms in a crystal. The lattice constant may be thought of as the distance between atom centers for two atoms on one side of a cube that makes up a unit cell in a crystal lattice. The lattice constant must be considered with the geometry of the structure in each case.

In the AlGaInP semiconductor laser, the n-type $(Al_{x1}Ga_{1-x1})_{1-y1}In_{y1}P$ cladding layer 2, $(Al_{x2}Ga_{1-x2})_{1-y2}In_{y2}P$ optical guide layer 3, $Ga_{1-z}In_zP$ quantum well layers 4a and $(Al_{x2}Ga_{1-x2})_{1-y2}In_{y2}P$ barrier layers 4b in the active layer 4, $(Al_{x2}Ga_{1-x2})_{1-y2}In_{y2}P$ optical guide layer 5 and p-type $(Al_{x1}Ga_{1-x1})_{1-y1}In_{y1}P$ cladding layer 6 have an even lattice mismatch with respect to the n-type GaAs substrate 1 of a value, for example, not smaller than $2.0\times10^{-4}$ and not larger than $3.0\times10^{-3}$, more preferably not smaller than $3.0\times10^{-4}$ and not larger than $3.0\times10^{-3}$, more specifically, as large as $1.0\times10^{-3}$. Therefore, in this case, the lattice constant $a_2$ of the n-type $(Al_{x1}Ga_{1-x1})_{1-y1}In_{y1}P$ cladding layer 2, $(Al_{x2}Ga_{1-x2})_{1-y2}In_{y2}P$ optical guide layer 3, $Ga_{1-z}In_zP$ quantum well layers 4a and $(Al_{x2}Ga_{1-x2})_{1-y2}In_{y2}P$ barrier layers 4b in the active layer 4, $(Al_{x2}Ga_{1-x2})_{1-y2}In_{y2}P$ optical guide layer 5 and p-type $(Al_{x1}Ga_{1-x1})_{1-y1}In_{y1}P$ cladding layer 6 is larger than the lattice constant $a_1$ of the n-type GaAs substrate 1. Consequently, the p-type GaInP intermediate layer 7 and the p-type GaAs cap layer has the same lattice constant $a_1$ as the n-type GaAs substrate 1.

In this case, the lattice mismatch is given to the n-type $(Al_{x1}Ga_{1-x1})_{1-y1}In_{y1}P$ cladding layer 2 and the p-type $(Al_{x1}Ga_{1-x1})_{1-y1}In_{y1}P$ cladding layer 6 by adjusting the mole fraction y1 of In in $(Al_{x1}Ga_{1-x1})_{1-y1}In_{y1}P$ forming them. The lattice mismatch is given to the $(Al_{x2}Ga_{1-x2})_{1-y2}In_{y2}P$ optical guide layers 3, 5 and the $(Al_{x2}Ga_{1-x2})_{1-y2}In_{y2}P$ barrier layers 4b by adjusting the mole fraction y2 of In in $(Al_{x2}Ga_{1-x2})_{1-y2}In_{y2}P$ forming them. The lattice mismatch is given to the $Ga_{1-z}In_zP$ quantum well layers 4a by adjusting the In mole fraction z in $Ga_{1-z}In_zP$ forming them.

Explained below is a relation between the degree $\Delta a/a$ of the lattice mismatch with respect to the n-type GaAs substrate 1 and the In mole fraction, taking the $Ga_{1-z}In_zP$ multi quantum well layer 4a as an example. That is, since the inter-lattice distance of GaP is 5.4512 Å and the inter-lattice distance of InP is 5.8688 Å, composition of the $Ga_{1-z}In_zP$ quantum well layer 4a in lattice matching with GaAs (whose lattice constant is 5.6533Å) should satisfy $$5.4512+0.4176xz=5.6533$$

and, since z=0.484, it is determined as $Ga_{0.516}In_{0.484}P$.

In contrast, when the $Ga_{1-z}In_zP$ quantum well layer 4a has a plus lattice mismatch with respect to the n-type GaAs substrate 1, namely, $\Delta a/a=1.0\times10^{-3}$, for example, the composition should satisfy $$5.4512+0.4176xz=5.6533\times1.001$$

and, since z=0.497, it is determined as $Ga_{0.503}In_{0.497}P$. Therefore, the mole fraction z of In for the $Ga_{1-z}In_zP$ quantum well layer 4a to have a plus lattice mismatch with respect to the n-type GaAs substrate 1 is larger than the mole fraction z of In for the $Ga_{1-z}In_zP$ quantum well layer 4a to be in lattice matching with the n-type GaAs substrate 1.

On the other hand, when the $Ga_{1-z}In_zP$ quantum well layer 4a has a minus lattice mismatch with respect to the n-type GaAs substrate 1, namely, $\Delta a/a=-1.0\times10^{-3}$, for example, the composition should satisfy $$5.4512+0.4176xz=5.6533\times0.999$$

and, since z=0.470, it is determined as $Ga_{0.530}In_{0.470}P$. Therefore, the mole fraction z of In for the $Ga_{1-z}In_zP$ quantum well layer 4a to have a minus lattice mismatch with respect to the n-type GaAs substrate 1 is smaller than the mole fraction z of In for the $Ga_{1-z}In_zP$ quantum well layer 4a to be in lattice matching with the n-type GaAs substrate 1.

Also for the n-type $(Al_{x1}Ga_{1-x1})_{1-y1}In_{y1}P$ cladding layer 2 and the p-type $(Al_{x1}Ga_{1-x1})_{1-y1}In_{y1}P$ cladding layer 6 and for $(Al_{x2}Ga_{1-x2})_{1-y2}In_{y2}P$ optical guide layers 3, 5 and $(Al_{x2}Ga_{1-x2})_{1-y2}In_{y2}P$ barrier layers 4b, the same theory as the $Ga_{1-z}In_zP$ quantum well layer 4a is applicable provided Ga in GaInP is replaced by (AlGa).

An exemplary numerical value of the mole fraction y1 of In in the n-type $(Al_{x1}Ga_{1-x1})_{1-y1}In_{y1}P$ cladding layer 2 and p-type $(Al_{x1}Ga_{1-x1})_{1-y1}In_{y1}P$ cladding layer 6, mole fraction y2 of In in the $(Al_{x2}Ga_{1-x2})_{1-y2}In_{y2}P$ optical guide layers 3, 5 and $(Al_{x2}Ga_{1-x2})_{1-y2}In_{y2}P$ barrier layers, and mole fraction z of In in the $Ga_{1-z}In_zP$ quantum well layers 4a is y1=y2=z=0.497.

Next explained is a method for manufacturing the AlGaInP semiconductor laser 100 according to the first embodiment explained above.

For manufacturing the AlGaInP semiconductor laser, semiconductor layers forming the AlGaInP semiconductor laser are made by Metalorganic Chemical Vapor Disposition (MOCVD), for example. In this case, trimethyl aluminum (TMA), trimethyl gallium (TMG), trimethyl indium (TMIn), arsine ($AsH_3$) and phosphine ($PH_3$) are usable as the source material of III-V compound semiconductors, $H_2Se$, for example, is used as the source material of the donor impurity, and dimethyl zinc (DMZ), for example, is used as the source material of the acceptor impurity.

Figure 3:
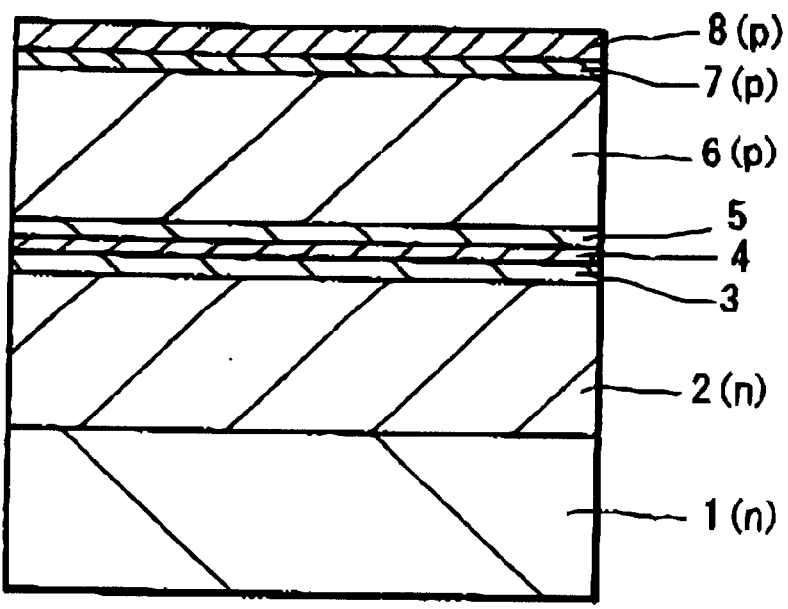
FIG. 3 is a cross-sectional view for explaining a method for manufacturing the index-guided AlGaInP semiconductor laser according to the first embodiment of the invention.

In greater detail, as shown in FIG. 3, sequentially grown on the n-type GaAs substrate 1 are the n-type $(Al_{x1}Ga_{1-x1})_{1-y1}In_{y1}P$ cladding layer 2, $(Al_{x2}Ga_{1-x2})_{1-y2}In_{y2}P$ optical guide layer 3, active layer 4 with the multi quantum well (MQW) structure including $Ga_{1-z}In_zP$ quantum well layers 4a and $(Al_{x2}Ga_{1-x2})_{1-y2}In_{y2}P$ barrier layers 4b, $(Al_{x2}Ga_{1-x2})_{1-y2}In_{y2}P$ optical guide layer 5, p-type $(Al_{x1}Ga_{1-x1})_{1-y1}In_{y1}P$ cladding layer 6, p-type GaInP intermediate layer 7 and p-type GaAs cap layer 8 by MOCVD. In this process, the flow rate of TMIn is adjusted to make a predetermined lattice mismatch in the n-type $(Al_{x1}Ga_{1-x1})_{1-y1}In_{y1}P$ cladding layer 2, $(Al_{x2}Ga_{1-x2})_{1-y2}In_{y2}P$ optical guide layer 3, active layer 4 with the MQW structure including $Ga_{1-z}In_zP$ quantum well layers 4a and $(Al_{x2}Ga_{1-x2})_{1-y2}In_{y2}P$ barrier layers 4b, $(Al_{x2}Ga_{1-x2})_{1-y2}In_{y2}P$ optical guide layer 5 and p-type $(Al_{x1}Ga_{1-x1})_{1-y1}In_{y1}P$ cladding layer 6. Control of the flow rate of TMIn in this process is not so strict as control for making the active layer 4 which must be strictly regulated in composition.

Figure 4:
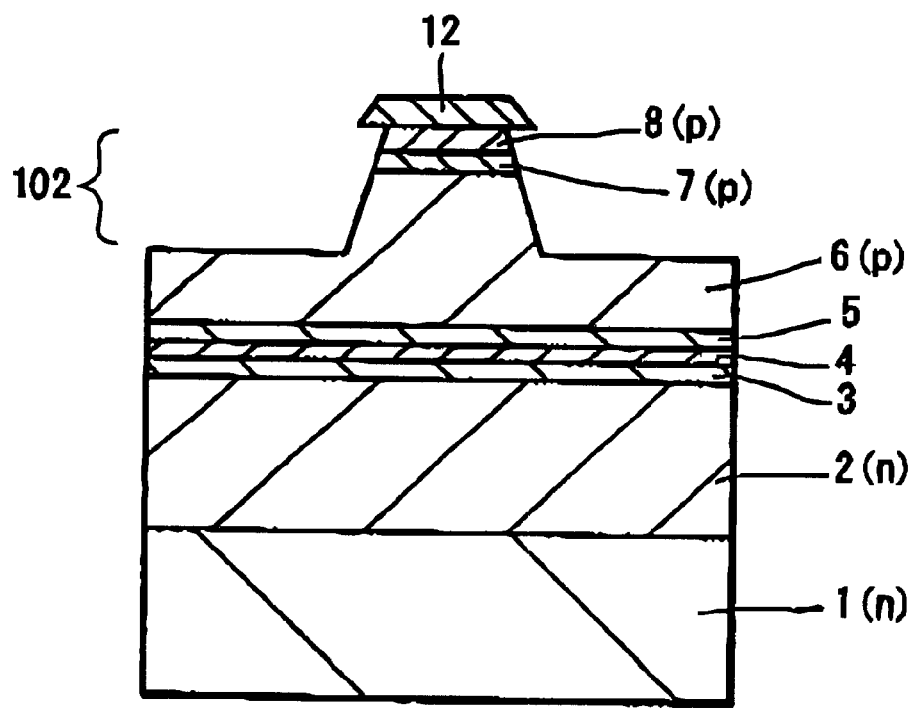
FIG. 4 is a cross-sectional view for explaining a method for manufacturing the index-guided AlGaInP semiconductor laser according to the first embodiment of the invention.

Next as shown in FIG. 4, after a $SiO_2$ film, SiN film, and so forth, are formed on the entire surface of the p-type GaAs cap layer 8 by CVD, they a patterned in to a stripe with a predetermined width to form a mask 12. Then, using the mask 12 as the etching mask, the layers are selectively removed to the depth partly removing the p-type $(Al_{x1}Ga_{1-x1})_{1-y1}In_{y1}P$ cladding layer 6 by wet etching. As a result, the upper lying portion 102 of the p-type $(Al_{x1}Ga_{1-x1})_{1-y1}In_{y1}P$ cladding layer 6, p-type GaInP intermediate layer 7 and p-type GaAs cap layers 8 are patterned into a stripe of a predetermined width extending in one direction.

Figure 5:
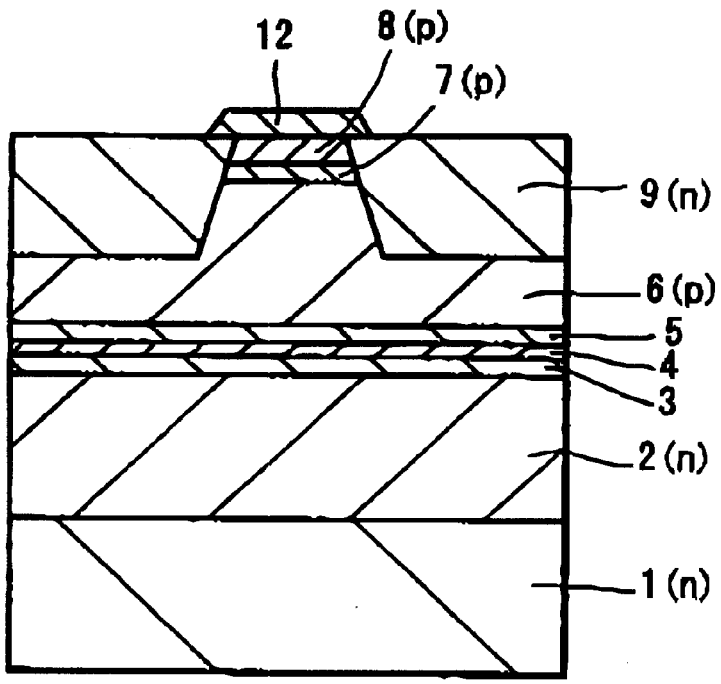
FIG. 5 is a cross-sectional view for explaining a method for manufacturing the index-guided AlGaInP semiconductor laser according to the first embodiment of the invention.

Next as shown in FIG. 5, using the same mask 12 as a growth mask, the n-type GaAs current blocking layer 9 is grown on opposite sides of the stripe portion by MOCVD.

Then, after removing the mask 12 by etching, the p-side electrode 10 is formed on the entire surface of the p-type GaAs cap layer 8 and the n-type current blocking layer 9, and the n-side electrode 11 is formed on the bottom surface of the n-type GaAs substrate 1, as shown in FIG. 1. As a result, the intended index-guided AlGaInP semiconductor laser 100 is obtained.

According to the first embodiment having the above-explained construction, since n-type $(Al_{x1}Ga_{1-x1})_{1-y1}In_{y1}P$ cladding layer 2, $(Al_{x2}Ga_{1-x2})_{1-y2}In_{y2}P$ optical guide layer 3, active layer 4 with the MQW structure including $Ga_{1-z}In_zP$ quantum well layers 4a and $(Al_{x2}Ga_{1-x2})_{1-y2}In_{y2}P$ barrier layers 4b, $(Al_{x2}Ga_{1-x2})_{1-y2}In_{y2}P$ optical guide layer 5 and p-type $(Al_{x1}Ga_{1-x1})_{1-y1}In_{y1}P$ cladding layer 6 have a uniform lattice mismatch with respect to the n-type GaAs substrate 1 as large as, for example, not smaller than $2.0 \times 10^{-4}$ and not larger than $3.0 \times 10^{-3}$, more preferably not smaller than $3.0 \times 10^{-4}$ and not larger than $3.0 \times 10^{-3}$, namely $1.0 \times 10^{-3}$, for example, diffusion of impurities in the n-type $(Al_{x1}Ga_{1-x1})_{1-y1}In_{y1}P$ cladding layer 2 and the p-type $(Al_{x1}Ga_{1-x1})_{1-y1}In_{y1}P$ cladding layer 6 can be prevented.

For the purpose of confirming the effect of the invention, prepared were devices in which the n-type $(Al_{x1}Ga_{1-x1})_{1-y1}In_{y1}P$ cladding layer 2, $(Al_{x2}Ga_{1-x2})_{1-y2}In_{y2}P$ optical guide layer 3, $Ga_{1-z}In_zP$ quantum well layers 4a and $(Al_{x2}Ga_{1-x2})_{1-y2}In_{y2}P$ barrier layers of the active layer 4, $(Al_{x2}Ga_{1-x2})_{1-y2}In_{y2}P$ optical guide layer 5 and p-type $(Al_{x1}Ga_{1-x1})_{1-y1}In_{y1}P$ cladding layer had a uniform lattice mismatch as large as $\Delta a/a = +1 \times 10^{-3}$ with respect to the n-type GaAs substrate 1, devices in which such layers had a lattice mismatch as large as $\Delta a/a = +3 \times 10^{-4}$, and devices in which such layers are in lattice matching with the n-type GaAs substrate 1 ($\Delta a/a = 0$), and aging yields were checked for lots. More specifically, using thirty devices for each lot, and determining that devices with less increase in operation current when activated for a given time for a rated output be acceptable, the percentage of acceptable devices was investigated for each lot. As a result, while the percentage was substantially 0% in case of devices of $\Delta a/a = 0$, the percentage increased in case of devices of $\Delta a/a = +3 \times 10^{-4}$, and approached nearly 100% in case of the devices of $\Delta a/a = +1 \times 10^{-3}$. This effect mainly owes to that the p-type $(Al_{x1}Ga_{1-x1})_{1-y1}In_{y1}P$ cladding layer 6 has a lattice mismatch with respect to the n-type GaAs substrate 1 and prevents diffusion of Zn into the active layer 4, which would otherwise cause the device to rapidly deteriorate on the order of several hours.

Therefore, according to the first embodiment, impurity doping in the manufacturing process can be controlled more easier, and diffusion of impurities into the active layer 4 can be effectively prevented even when the impurities are doped into a location nearest to the active layer 4. This contributes to improving the emission efficiency of the AlGaInP semiconductor laser, reducing the operation current, improving the reliability of the device and improving the operation characteristics of the device under high temperatures. The AlGaInP semiconductor laser can be realized by the easily controllable technique of giving a uniform lattice mismatch to the n-type $(Al_{x1}Ga_{1-x1})_{1-y1}In_{y1}P$ cladding layer 2, p-type $(Al_{x2}Ga_{1-x2})_{1-y2}In_{y2}P$ optical guide layer, $Ga_{1-z}In_zP$ quantum layers 4a and $(Al_{x2}Ga_{1-x2})_{1-y2}In_{y2}P$ barrier layers 4b of the active layer 4, $(Al_{x2}Ga_{1-x2})_{1-y2}In_{y2}P$ optical guide layer 5 and p-type $(Al_{x1}Ga_{1-x1})_{1-y1}In_{y1}P$ cladding layer 6.

Next explained is the second embodiment of the invention. In the AlGaInP semiconductor light emitting device according to the second embodiment, the n-type $(Al_{x1}Ga_{1-x1})_{1-y1}In_{y1}P$ cladding layer 2 and the p-type $(Al_{x1}Ga_{1-x1})_{1-y1}In_{y1}P$ cladding layer 6 have a uniform lattice mismatch with respect to the n-type GaAs substrate 1 not smaller than $2.0 \times 10^{-4}$ and not larger than $3.0 \times 10^{-3}$, more preferably, not smaller than $3.0 \times 10^{-4}$ and not larger than $3.0 \times 10^{-3}$, more specifically $1.0 \times 10^{-3}$, for example. In this case, the $(Al_{x2}Ga_{1-x2})_{1-y2}In_{y2}P$ optical guide layers 3, 5 and the active layer 4 are in lattice matching with the n-type GaAs substrate 1 for example. In the other respects, the embodiment shown here is the same as the first embodiment, and not explained here.

Also the second embodiment realizes the same effects as those of the first embodiment.

Next explained is the third embodiment of the invention. In the AlGaInP semiconductor light emitting device according to the third embodiment, the p-type $(Al_{x1}Ga_{1-x1})_{1-y1}In_{y1}P$ cladding layer 6 has a lattice mismatch with respect to the n-type GaAs substrate 1 not smaller than $2.0 \times 10^{-4}$ and not larger than $3.0 \times 10^{-3}$, more preferably, not smaller than $3.0 \times 10^{-4}$ and not larger than $3.0 \times 10^{-3}$, more specifically $1.0 \times 10^{-3}$, for example, whereas the n-type $(Al_{x1}Ga_{1-x1})_{1-y1}In_{y1}P$ cladding layer 2 has a lattice mismatch with respect to the n-type GaAs substrate 1 not smaller than $-1.5 \times 10^{-3}$ and not larger than $-2.0 \times 10^{-4}$, more preferably, not smaller than $-1.5 \times 10^{-3}$ and not larger than $-3.0 \times 10^{-4}$, more specifically $-1.0 \times 10^{-3}$, for example. In this case, the $(Al_{x2}Ga_{1-x2})_{1-y2}In_{y2}P$ optical guide layers 3, 5 and the active layer 4 are in lattice matching with the n-type GaAs substrate 1, for example.

The mole fraction y1 of In in the n-type $(Al_{x1}Ga_{1-x1})_{1-y1}In_{y1}P$ cladding layer 2 having the lattice mismatch of $-1.0 \times 10^{-3}$ relative to the n-type GaAs substrate 1 is smaller than the mole fraction y1 of In in the same n-type $(Al_{x1}Ga_{1-x1})_{1-y1}In_{y1}P$ cladding layer 2 in lattice matching with the n-type GaAs substrate 1. In this case, the mole fraction y1 of In in the $(Al_{x1}Ga_{1-x1})_{1-y1}In_{y1}P$ cladding layer 2 is 0.470. On the other hand, the mole fraction y1 of In in the p-type $(Al_{x1}Ga_{1-x1})_{1-y1}In_{y1}P$ cladding layer 6 is 0.49. In the other respect, the embodiment shown here is the same as the first embodiment, and not explained here.

Also the third embodiment realizes the same effects as those of the first embodiment. In this case, since the n-type $(Al_{x1}Ga_{1-x1})_{1-y1}In_{y1}P$ cladding layer 2 has a minus lattice mismatch with respect to the n-type GaAs substrate 1 and the p-type $(Al_{x1}Ga_{1-x1})_{1-y1}In_{y1}P$ cladding layer 6 has a plus lattice mismatch relative to the n-type GaAs substrate 1, the density of group V holes contributing to diffusion of Se is considered to be low in the n-type $(Al_{x1}Ga_{1-x1})_{1-y1}In_{y1}P$ cladding layer 2, and the density of group III holes contributing to diffusion of Zn is considered to be low in the p-type $(Al_{x1}Ga_{1-x1})_{1-y1}In_{y1}P$ cladding layer 6. Therefore, according to the third embodiment, diffusion of impurities can be prevented very effectively in the n-type $(Al_{x1}Ga_{1-x1})_{1-y1}In_{y1}P$ cladding layer 2 and in the p-type $(Al_{x1}Ga_{1-x1})_{1-y1}In_{y1}P$ cladding layer 6, respectively.

Next explained is the fourth embodiment of the invention. In the AlGaInP semiconductor light emitting device 100 according to the fourth embodiment, the p-type $(Al_{x1}Ga_{1-x1})_{1-y1}In_{y1}P$ cladding layer 6 has a uniform lattice mismatch relative to the n-type GaAs substrate 1 not smaller than $2.0 \times 10^{-4}$ and not larger than $3.0 \times 10^{-3}$, more preferably, not smaller than $3.0 \times 10^{-4}$ and not larger than $3.0 \times 10^{-3}$, more specifically $1.0 \times 10^{-3}$, for example. In this case, the mole fraction y1 of In in the p-type $(Al_{x1}Ga_{1-x1})_{1-y1}In_{y1}P$ cladding layer 6 is 0.497, and n-type $(Al_{x1}Ga_{1-x1})_{1-y1}In_{y1}P$ cladding layer 2, $(Al_{x2}Ga_{1-x2})_{1-y2}In_{y2}P$ optical guide layers 3, 5 and the active layer 4 are in lattice matching with the n-type GaAs substrate 1, for example. In the other respects, the embodiment shown here is the same as the first embodiment, and not explained here.

The fourth embodiment attains the same effects as the first embodiment by preventing diffusion of impurities in the p-type $(Al_{x1}Ga_{1-x1})_{1-y1}In_{y1}P$ cladding layer 6.

Next explained is the fifth embodiment of the invention. In the AlGaInP semiconductor light emitting device according to the fifth embodiment, the n-type $(Al_{x1}Ga_{1-x1})_{1-y1}In_{y1}P$ cladding layer 2 has a uniform lattice mismatch relative to the n-type GaAs substrate 1 not larger than $-1.5 \times 10^{-3}$ and not larger than $-2.0 \times 10^{-4}$, more preferably, not smaller than $-1.5 \times 10^{-4}$ and not larger than $-3.0 \times 10^{-4}$, more specifically $-1.0 \times 10^{-3}$, for example. In this case, the mole fraction y1 of In in the n-type $(Al_{x1}Ga_{1-x1})_{1-y1}In_{y1}P$ cladding layer 2 is 0.470, and $(Al_{x2}Ga_{1-x2})_{1-y2}In_{y2}P$ optical guide layers 3, 5, active layer 4 and p-type $(Al_{x1}Ga_{1-x1})_{1-y1}In_{y1}P$ cladding layer 6 are in lattice matching with the n-type GaAs substrate 1, for example. In the other respects, the embodiment shown here is the same as the first embodiment, and not explained here.

The fifth embodiment attains the same effects as the first embodiment by preventing diffusion of impurities in the n-type $(Al_{x1}Ga_{1-x1})_{1-y1}In_{y1}P$ cladding layer 2.

Figure 6:
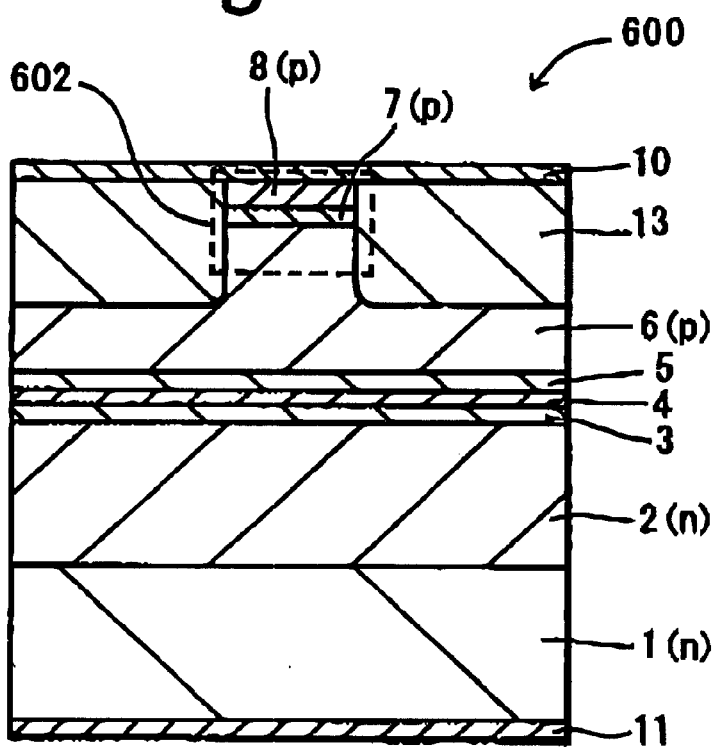
FIG. 6 is a cross-sectional view for explaining a method for manufacturing a gain-guided AlGaInP semiconductor laser according to the sixth embodiment of the invention.

Next explained is the sixth embodiment of the invention. FIG. 6 is a cross-sectional view of a gain-guided AlGaInP semiconductor laser 600 according to the sixth embodiment. The AlGaInP semiconductor laser 600 has a SCH structure, and its active layer has a MQW structure.

As shown in FIG. 6, in the AlGaInP semiconductor laser according to the sixth embodiment, the upper-lying portion of the p-type $(Al_{x1}Ga_{1-x1})_{1-y1}In_{y1}P$ cladding layer 6, p-type GaInP intermediate layer 7 and p-type GaAs cap layer 8 have a stripe portion 602 extending in one direction, and high-resistance regions 13 are formed in the p-type $(Al_{x1}Ga_{1-x1})_{1-y1}In_{y1}P$ cladding layer 6, p-type GaInP intermediate layer 7 and p-type GaAs cap layer 8 at opposite sides of the stripe portion 602 by ion implantation of B, for example, to form a current blocking structure. The p-side electrode 10 is formed on the p-type GaAs cap layer 8 and the high-resistance region 13.

Similarly to the AlGaInP semiconductor laser 100 according to the first embodiment, for example, also in the AlGaInP semiconductor laser 600 shown here, the n-type $(Al_{x1}Ga_{1-x1})_{1-y1}In_{y1}P$ cladding layer 2, $(Al_{x2}Ga_{1-x2})_{1-y2}In_{y2}P$ optical guide layer 3, active layer 4, $(Al_{x2}Ga_{1-x2})_{1-y2}In_{y2}P$ optical guide layer 5 and p-type $(Al_{x1}Ga_{1-x1})_{1-y1}In_{y1}P$ cladding layer 6 have a uniform lattice mismatch relative to the n-type GaAs substrate 1 not smaller than $2.0 \times 10^{-4}$ and not larger than $3.0 \times 10^{-3}$, more preferably, not smaller than $3.0 \times 10^{-4}$ and not larger than $3.0 \times 10^{-3}$, more specifically, $1.0 \times 10^{-3}$, for example. In the other respects, the AlGaInP semiconductor laser 600 shown here is the same as that of the first embodiment, and not explained here.

The AlGaInP semiconductor laser 600 according to the sixth embodiment is made in the same process as used for making the AlGaInP semiconductor laser 100 according to the first embodiment, namely, by sequentially growing on the n-type GaAs substrate 1 the n-type $(Al_{x1}Ga_{1-x1})_{1-y1}In_{y1}P$ cladding layer 2, $(Al_{x2}Ga_{1-x2})_{1-y2}In_{y2}P$ optical guide layer 3, active layer 4 of a MQW structure including $Ga_{1-z}In_zP$ quantum well layers 4a and $(Al_{x2}Ga_{1-x2})_{1-y2}In_{y2}P$ barrier layers 4b, $(Al_{x2}Ga_{1-x2})_{1-y2}In_{y2}P$ optical guide layer 5, p-type $(Al_{x1}Ga_{1-x1})_{1-y1}In_{y1}P$ cladding layer 6, p-type GaInP intermediate layer 7 and p-type GaAs cap layer 8 by MOCVD.

Next formed on the p-type GaAs cap layer 8 is a mask (not shown) with a predetermined configuration. Using the mask as an injection mask, B is selective doped into the p-type GaAs cap layer 8, p-type GaInP intermediate layer 7 and an upper-lying portion of the $(Al_{x1}Ga_{1-x1})_{1-y1}In_{y1}P$ cladding layer 6 to form a high-resistant region 13. Then, after removing the mask using the injection mask, the p-side electrode 10 is formed on the entire surface of the p-type GaAs cap layer 8 and the high-resistance region 13, and the n-side electrode 11 is formed on the bottom surface of the n-type GaAs substrate 1. As a result, the intended gain-guided AlGaInP semiconductor laser 600 is obtained.

According to the sixth embodiment, the same effects as the first embodiment can be attained in gain-guided AlGaInP semiconductor laser 600.

Figure 7:
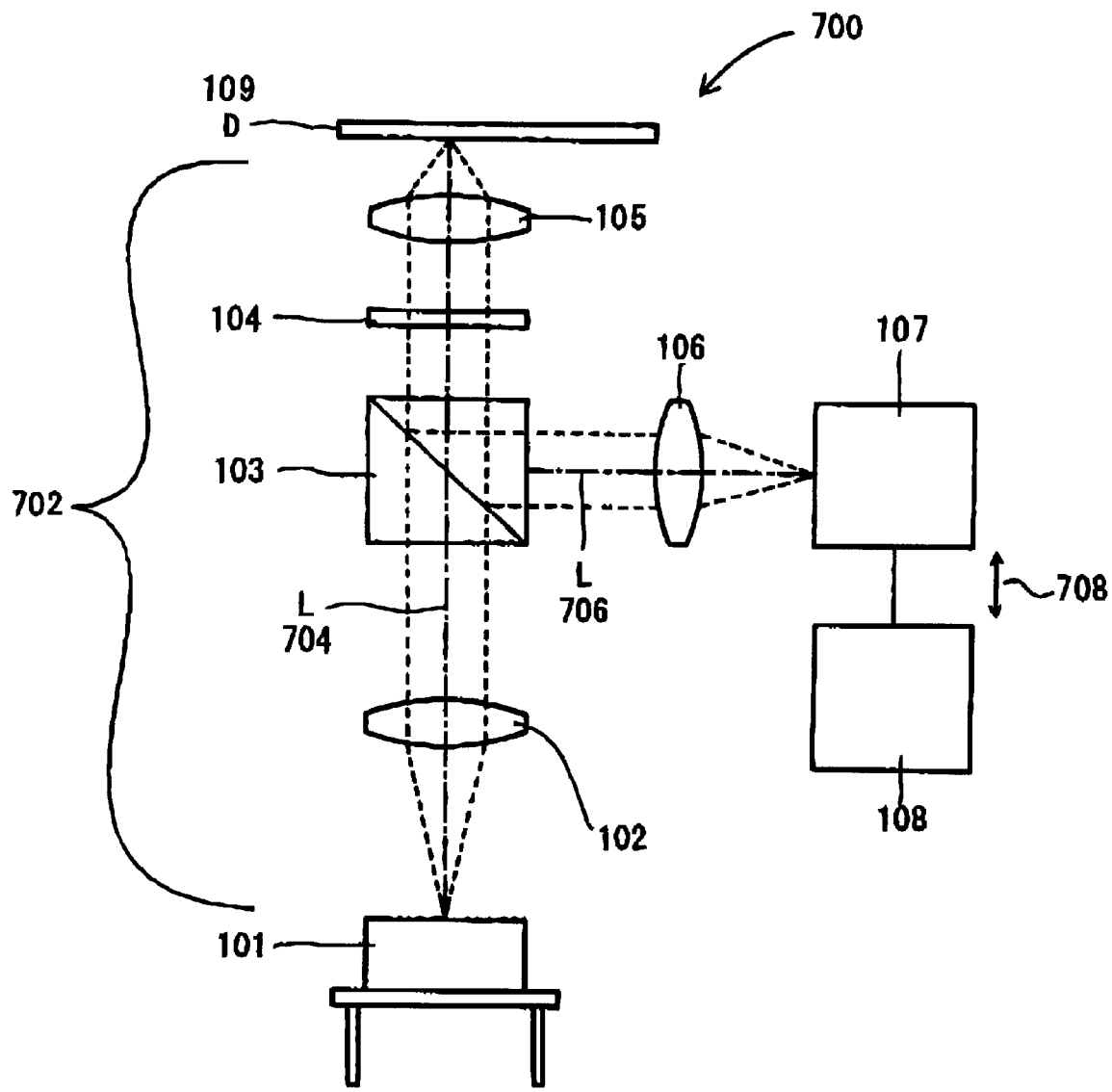
FIG. 7 is a schematic diagram showing an optical disc reproducing apparatus using the AlGaInP semiconductor lasers according to the first, second, third, fourth, fifth or sixth embodiment of the invention.

Next explained is an optical disc reproducing apparatus 700 using an AlGaInP semiconductor laser according to the first, second, third, fourth, fifth of sixth embodiment as its light source. FIG. 7 shows a construction of the optical disc reproducing apparatus 700.

As shown in FIG. 7, the optical disc reproducing apparatus includes a semiconductor laser 101 as its light source. The semiconductor laser 101 is one of AlGaInP semiconductor laser 100 according to the first to six embodiments. The optical disc reproducing apparatus 700 further includes a known optical system 702 for introducing light from the semiconductor laser 101 into an optical disc D 109 and for reproducing reflected light (signal light) from the optical disc D 109 namely, is collimate lense 102, beam splitter 103, ¼ wavelength plate 104, objective lens 105, detective lens 106, signal light detecting photodetector 107, and signal light reproducing circuit 108.

In the optical disc reproducing apparatus 700, light L 704 from the semiconductor laser 101 is shaped into parallel beams of light by the collimate lens 102, then running through the beam splitter 103, adjusted in polarization by the ¼ wavelength plate 104, and oriented and introduced onto the optical disc D 109 by the objective lens 105. Then, signal light L 706 reflected from the optical disc D 109 runs through the object lens 105 and ¼ wavelength plate 104, it is reflected by the beam splitter 103, then running through the detective lens 106, entering into the signal light detection photodetector 107, converted into an electric signal 708 there, and information written on the optical disc D 709 is reproduced in the signal light reproducing circuit 108.

The optical disc reproducing apparatus 700 is improved in reliability and operation characteristics under high temperatures because the semiconductor laser 101 used as its light source is one of the AlGaInP semiconductor lasers according to the first to sixth embodiments.

Although the embodiment shown here has been explained as using the AlGaInP semiconductor laser 100 according to one of first to sixth embodiments as a light source of an optical disc reproducing apparatus 700, needless to say, the laser 100 is usable as a light source of an optical disc recording/reproducing apparatus or optical disc recording apparatus, and also as a light source of an optical pickup apparatus.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims. For example, materials, numerical values and structures suggested in the embodiments are only examples, and other materials, numerical values and structures may be employed where necessary.

In the first to sixth embodiments, the lattice mismatch of each semiconductor layer is uniform within the layer. However, the mismatch may vary within each semiconductor layer. When using a plurality of semiconductors having a lattice mismatch relative to the n-type GaAs substrate 1, the degree of the lattice mismatch may be different between layers. More specifically, in the fist embodiment, for example, the lattice mismatch of the active layer 4, for example, may be smaller than the lattice mismatch of the other semiconductor layers.

In the first to sixth embodiments, the lattice mismatch of AlGaInP semiconductor layers such as n-type $(Al_{x1}Ga_{1-x1})_{1-y1}In_{y1}P$ cladding layer 2 and p-type $(Al_{x1}Ga_{1-x1})_{1-y1}In_{y1}P$ cladding layer 6 is given by adjusting the content of In in AlGaInP, whereas the lattice mismatch in semiconductor layers such as $Ga_{1-z}In_zP$ quantum well layers 4a is given by adjusting the content of In in GaInP. However, the lattice mismatch of AlGaInP semiconductor layers may be given by adjusting the content of the entirety of Al and Ga in AlGaInP, and the lattice mismatch of GaInP semiconductor layers may be given by adjusting the content of Ga in GaInP.

In the first to six embodiments, the conduction types of the substrate 1 and semiconductor layers 2,3,4,5,6,7,8, and 9 may be opposite from those suggested there. Additionally, molecular beam epitaxy (MBE), or any other appropriate process, may be employed in lieu of MOCVD for growth of semiconductor layers.

In the first to sixth embodiments, explanation has been made as using the invention in AlGaInP semiconductor lasers with a SCH structure. However, the invention is applicable to AlGaInP semiconductor lasers with DH structures (double heterostrucures) or to AlGaInP light emitting diodes or self-pulsation AlGaInP semiconductor lasers.

Additionally, the invention is applicable to semiconductor light emitting devices other than AlGaInP semiconductor light emitting devices, namely, AlGaAs semiconductor light emitting devices using II-VI compound semiconductors, semiconductor light emitting devices using nitride III-V compound semiconductors, or GaInAsP semiconductor light emitting devices, and to optical pickup apparatuses, optical recording and/or reproducing apparatuses using these semiconductor light emitting devices as their light sources.

As explained above, the semiconductor light emitting devices 100 according to the first and second aspects of the invention, in which at least one of the p-type cladding layer and the n-type cladding layer has a lattice mismatch relative to the base body not smaller than $2.0\times10^{-4}$ and not larger than $3.0\times10^{-3}$ or not smaller than $-1.5\times10^{-3}$ and not larger than $-2.0\times10^{-4}$, or at least one of the p-type cladding layer and the n-type cladding layer has a lattice mismatch relative to the base body not smaller than $2.0\times10^{-4}$ and not larger than $3.0\times10^{-3}$ or not smaller than $-1.5\times10^{-3}$ and not larger than $-2.0\times10^{-4}$, can prevent diffusion of impurities in the p-type cladding layer or the n-type cladding layer, and can effectively prevent diffusion of the impurities into the active layer.

The semiconductor light emitting device 100 according to the third aspect of the invention, in which the active layer, p-type cladding layer and n-type cladding layer have a lattice mismatch relative to the base body, can prevent diffusion of impurities in the p-type cladding layer and the n-type cladding layer, and can effectively prevent diffusion of the impurities into the active layer.

Therefore, doping of impurities in the manufacturing process can be controlled easily, and deterioration of the device 100 otherwise caused by diffusion of impurities into the active layer 4 can be prevented even when the impurities are doped into a location nearest to the active layer 4. Thus, the invention can improve the emission efficiency of semiconductor light emitting devices, decrease the operation current, and improve the reliability. Moreover, these semiconductor light emitting devices can be manufactured easily, and can be improved in operating characteristics under high temperatures.

The optical recording and/or reproducing apparatus 700 according to the invention can be improved in reliability and operating characteristics under high temperatures by using a semiconductor light emitting devices as its light source.

What is claimed is:

1. A semiconductor light emitting device, comprising:
    a structure including an active layer between a p-type cladding layer and an n-type cladding layer on a base body, wherein
        at least one of said p-type cladding layer and said n-type cladding layer has a lattice mismatch relative to said base body that is not smaller than $-1.5\times10^{-3}$ and not larger than $-2.0\times10^{-4}$.

2. The semiconductor light emitting device according to claim 1 wherein at least one of said p-type cladding layer and said n-type cladding layer has a lattice mismatch relative to said base body that is one of (i) not smaller than $3.0\times10^{-4}$ and not larger than $1.0\times10^{-3}$ and (ii) not smaller than $-1.5\times10^{-3}$ and not larger than $-3.0\times10^{-4}$.

3. The semiconductor light emitting device according to claim 1 wherein said lattice mismatch is substantially uniform within said p-type cladding layer or said n-type cladding layer.

4. The semiconductor light emitting device according to claim 1 wherein said lattice mismatch varies within said p-type cladding layer or said n-type cladding layer.

5. The semiconductor light emitting device according to claim 1 wherein said n-type cladding layer has a lattice mismatch relative to said base body that is not smaller than $-1.5 \times 10^{-3}$ and not larger than $-2.0 \times 10^{-4}$.

6. The semiconductor light emitting device according to claim 1 further including a first optical guide layer between said p-type cladding layer and said active layer, and a second optical guide layer between said n-type cladding layer and said active layer.

7. The semiconductor light emitting device according to claim 6 wherein at least one of said first optical guide layer and said second optical guide layer has a lattice mismatch relative to said base body as large as not smaller than $2.0 \times 10^{-4}$ and not larger than $3.0 \times 10^{-3}$ or not smaller than $-1.5 \times 10^{-3}$ and not larger than $-2.0 \times 10^{-4}$.

8. The semiconductor light emitting device according to claim 1 wherein said semiconductor light emitting device is an AlGaInP semiconductor light emitting device, and said base body is a GaAs substrate.

9. The semiconductor light emitting device according to claim 8 wherein said lattice mismatch is given by adjusting the content of In in AlGaInP forming said p-type cladding layer and said n-type cladding layer.

10. The semiconductor light emitting device according to claim 8 wherein said lattice mismatch is given by adjusting the content of the entirety of Al and Ga in AlGaInP forming said p-type cladding layer and said n-type cladding layer.

11. The semiconductor light emitting device according to claim 1 wherein said semiconductor light emitting device is an index-guided semiconductor light emitting device.

12. The semiconductor light emitting device according to claim 1 wherein said semiconductor light emitting device is a gain-guided semiconductor light emitting device.

13. A semiconductor light emitting device; comprising:
a structure including an active layer between a p-type cladding layer and an n-type cladding layer on a base body, wherein
at least one of said p-type cladding layer, said n-type cladding layer, and said active layer has a lattice mismatch relative to said base body that is not smaller than $-1.5 \times 10^{-3}$ and not larger than $-2.0 \times 10^{-4}$.

14. The semiconductor light emitting device according to claim 13 wherein at least one of said p-type cladding layer, said n-type cladding layer, and said active layer has a lattice mismatch relative to said base body (i) not smaller than $3.0 \times 10^{-4}$ and not larger than $1.0 \times 10^{-3}$ and (ii) not smaller than $-1.5 \times 10^{-3}$ and not larger than $-3.0 \times 10^{-4}$.

15. The semiconductor light emitting device according to claim 13 herein said lattice mismatch is substantially uniform among said p-type cladding layer, said n-type cladding layer and said active layer.

16. The semiconductor light emitting device according to claim 13 wherein said lattice mismatch is uniform within said p-type cladding layer, said n-type cladding layer, or said active layer.

17. The semiconductor light emitting device according to claim 13 wherein said lattice mismatch varies within said p-type cladding layer, said n-type cladding layer or said active layer.

18. The semiconductor light emitting device according to claim 13 wherein said n-type cladding layer has a lattice mismatch relative to said base body that is not smaller than $-1.5 \times 10^{-3}$ and not larger than $-2.0 \times 10^{-4}$.

19. The semiconductor light emitting device according to claim 13 further including a first optical guide layer between said p-type cladding layer and said active layer, and a second optical guide layer between said n-type cladding layer and said active layer.

20. The semiconductor light emitting device according to claim 19 wherein at least one of said first optical guide layer and said second optical guide layer has a lattice mismatch relative to said base body as large as not smaller than $2.0 \times 10^{-4}$ and not larger than $3.0 \times 10^{-3}$ or not smaller than $-1.5 \times 10^{-3}$ and not larger than $-2.0 \times 10^{-4}$.

21. The semiconductor light emitting device according to claim 13 wherein said semiconductor light emitting device is an AlGaInP semiconductor light emitting device, and said base body is a GaAs substrate.

22. The semiconductor light emitting device according to claim 21 wherein said lattice mismatch of said p-type cladding layer and said n-type cladding layer is given by adjusting the content of In in AlGaInP forming said p-type cladding layer and said n-type cladding layer.

23. The semiconductor light emitting device according to claim 21 wherein said lattice mismatch of said p-type cladding layer and said n-type cladding layer is given by adjusting the content of the entirety of Al and Ga in AlGaInP forming said p-type cladding layer and said n-type cladding layer.

24. The semiconductor light emitting device according to claim 21 wherein said lattice mismatch of said active layer is given by adjusting the content of In in GaInP forming said active layer.

25. The semiconductor light emitting device according to claim 21 wherein said lattice mismatch of said active layer is given by adjusting the content of Ga in GaInP forming said active layer.

26. The semiconductor light emitting device according to claim 13 wherein said semiconductor light emitting device is an index-guided semiconductor light emitting device.

27. The semiconductor light emitting device according to claim 13 wherein said semiconductor light emitting device is a gain-guided semiconductor light emitting device.

28. A semiconductor light emitting device, comprising:
a structure including an active layer between a p-type cladding layer and an n-type cladding layer on a base body,
wherein said p-type cladding layer, said n-type cladding layer and said active layer are in lattice mismatch with said base body,
wherein said lattice mismatch is not smaller than $-1.5 \times 10^{-3}$ and not larger than $-2.0 \times 10^{-4}$.

29. The semiconductor light emitting device according to claim 28 wherein said lattice mismatch is not smaller than $2.0 \times 10^{-4}$ and not larger than $3.0 \times 10^{-3}$.

30. The semiconductor light emitting device according to claim 28 wherein said p-type cladding layer has a lattice mismatch relative to said base body that is not smaller than $2.0 \times 10^{-4}$ and not larger than $3.0 \times 10^{-3}$, and said n-type cladding layer has a lattice mismatch relative to said base body that is not smaller than $-1.5 \times 10^{-3}$ and not larger than $-2.0 \times 10^{-4}$.

31. In an optical recording and/or reproducing apparatus using as a light source thereof a semiconductor light emitting device, the semiconductor light emitting device comprising:
a structure including an active layer between a p-type cladding layer and an n-type cladding layer on a base body, wherein
at least one of said p-type cladding layer and said n-type cladding layer has a lattice mismatch relative to said base body that is not smaller than $-1.5 \times 10^{-3}$ and not larger than $-2.0 \times 10^{-4}$.

32. The semiconductor light emitting device according to claim 31 wherein said semiconductor light emitting device is an AlGaInP semiconductor device, and said base body is a GaAs substrate.

33. An optical recording and/or reproducing apparatus using as a light source thereof a semiconductor light emitting device, the optical recording and/or reproducing apparatus comprising:

a structure including an active layer between a p-type cladding layer and an n-type cladding layer on a base body, wherein at least one of said p-type cladding layer, said n-type cladding layer, and said active layer has a lattice mismatch relative to said base body that is not smaller than $-1.5 \times 10^{-3}$ and not larger than $-2.0 \times 10^{-4}$.

34. The optical recording and/or reproducing apparatus according to claim 33 wherein said light emitting device is an AlGaInP semiconductor device, and said base body is a GaAs substrate, and wherein at least one of said p-type cladding layer, said n-type cladding layer, and said active layer has a lattice mismatch relative to said base body that is not smaller than $2.0 \times 10^{-4}$ and not larger than $1.0 \times 10^{-3}$.

* * * * *